(12) United States Patent
Kim et al.

(10) Patent No.: US 8,355,288 B2
(45) Date of Patent: Jan. 15, 2013

(54) SEMICONDUCTOR MEMORY DEVICE WITH TEMPERATURE SENSING DEVICE CAPABLE OF MINIMIZING POWER CONSUMPTION IN REFRESH

(75) Inventors: Kyung-Hoon Kim, Kyoungki-do (KR); Patrick B. Moran, Eugene, OR (US)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 13/240,136

(22) Filed: Sep. 22, 2011

(65) Prior Publication Data

US 2012/0014198 A1    Jan. 19, 2012

Related U.S. Application Data

(62) Division of application No. 11/785,059, filed on Apr. 13, 2007, now Pat. No. 8,045,411.

(30) Foreign Application Priority Data

Apr. 13, 2006   (KR) .......................... 10-2006-0033729

(51) Int. Cl.
    *G11C 7/04* (2006.01)
(52) U.S. Cl. .......................... 365/211; 365/203; 365/212
(58) Field of Classification Search ................... 365/211, 365/212, 203, 189.07, 189.08
    See application file for complete search history.

(56) References Cited

U.S. PATENT DOCUMENTS

| | | | |
|---|---|---|---|
| 6,438,057 B1 | 8/2002 | Ruckerbauer | |
| 2005/0074051 A1* | 4/2005 | Won et al. | 374/170 |
| 2005/0141311 A1* | 6/2005 | Kim et al. | 365/222 |
| 2005/0185491 A1* | 8/2005 | Kim et al. | 365/222 |

FOREIGN PATENT DOCUMENTS

| | | |
|---|---|---|
| CN | 1115102 | 1/1996 |
| CN | 1637942 | 7/2005 |
| CN | 1685441 | 10/2005 |
| JP | 2003-077273 | 3/2003 |
| JP | 2003-151274 | 5/2003 |
| JP | 2003-304150 | 10/2003 |
| JP | 2005-196934 | 7/2005 |
| JP | 2005-235362 | 9/2005 |
| JP | 2007-123987 | 5/2007 |
| JP | 2011-081893 | 4/2011 |

OTHER PUBLICATIONS

Office Action issued by the Japan Patent Office on May 29, 2012.
Patent Certificate and Publication of Granted Chinese invention issued by the Chinese Patent Office on Apr. 25, 2012.

* cited by examiner

*Primary Examiner* — Richard Elms
*Assistant Examiner* — Hien Nguyen
(74) *Attorney, Agent, or Firm* — IP & T Group LLP (57) ABSTRACT

A semiconductor memory device capable of measuring a temperature without the influence of noise includes a temperature sensing device for sensing a current temperature in response to a control signal, wherein the semiconductor memory device enters a power save mode for a predetermined time starting from an activation of the control signal and wherein the power save mode has substantially no power consumption. A method for driving a semiconductor memory device in accordance with the present invention includes sensing a current temperature in response to a control signal and entering a power save mode for a predetermined time starting from an activation of the control signal, wherein the power save mode has substantially no power consumption.

65 Claims, 6 Drawing Sheets

SEMICONDUCTOR MEMORY DEVICE WITH TEMPERATURE SENSING DEVICE CAPABLE OF MINIMIZING POWER CONSUMPTION IN REFRESH

CROSS-REFERENCE TO RELATED APPLICATIONS

This application is a division of U.S. patent application Ser. No. 11/785,059 filed on Apr. 13. 2007, which claims priority of Korean patent application number 10-2006-0033729, filed on Apr. 13, 2006. The disclosure of each of the foregoing applications is incorporated herein by reference in its entirety.

BACKGROUND OF THE INVENTION

The present invention relates to a semiconductor design technology; more particularly, to a semiconductor memory device capable of measuring a temperature without the influence of noise.

Generally, in semiconductor memory devices, a cell includes a transistor, as a switch, and a capacitor storing electric charges (data). Since the data storage is carried out by the charges which are accumulated in the capacitor, power consumption is not caused basically. However, the initially stored charges can be extinguished because there is a leakage current which is caused by the PN junction of MOS transistor. Then, this leakage current causes a loss of the stored data. To prevent this problem, a recharging operation should be carried out before the data loss and this recharging operation is achieved by reading out the data from the memory cell and then recharging the memory cell again based on the read-out data.

The stored data are maintained only when this recharging operation is periodically repeated. The recharging process of the electric charges in the memory cells is called refresh operation and the refresh control is achieved by a DRAM controller. In DRAMs, power consumption is created due to the need of the refresh operation. It is very important to reduce the power consumption in battery operated system, such as portable electronic device which demands the low power consumption and it is a critical issue these days.

One of various attempts to reduce the power consumption required in the refresh is to diversify the refresh cycle according to a temperature. The data retention time in the DRAM is lengthened as a temperature is decreased. Therefore, if the temperature field is divided into the different domain frames and the frequency of the refresh clock is relatively lowered in the low temperature field, the power consumption is decreased. Accordingly, a device is needed to sense the temperature in the DRAM and to output the information on the sensed temperature.

Moreover, with the increase of the integration and working speed in the semiconductor memory devices, heat is generated more and more in the semiconductor memory device itself. This generated heat increases the inner temperature in the semiconductor memory device and the inner temperature disturbs the normal operation. The inner temperature can cause the inferiority of the semiconductor memory device and can function as a reason why the semiconductor memory device itself is damaged. Therefore, the temperature of the semiconductor memory device should be accurately sensed. Accordingly, a device is needed to exactly sense the temperature in the DRAM and to output the information on the sensed temperature.

Figure 1:
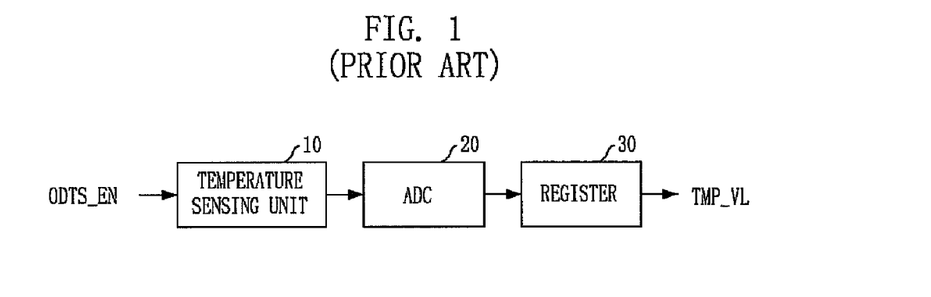
FIG. 1 is a block diagram of a conventional temperature sensing device in a semiconductor memory device.

FIG. 1 is a block diagram of a conventional temperature sensing device in a semiconductor memory device.

Referring to FIG. 1, the conventional temperature sensing device includes a temperature sensing unit 10 to sense a temperature in response to a driving signal ODTS_EN, an ADC (Analog to Digital Converter) 20 to convert an analog signal from the temperature sensing unit 10 into a digital signal, and a register 30 to store a digitalized temperature value form the ADC 20.

The operation of the conventional temperature sensing device will now be described.

First, when the driving signal ODTS_EN is activated, the temperature sensing unit 10 senses the current temperature in response to the activated driving signal ODTS_EN and outputs an analog temperature value. Subsequently, the ADC 20 converts the analog temperature value into a digital signal. The register 30 stores the output from the ADC 20 and outputs it as a temperature value TM_VL.

However, the driving of the temperature sensing device as described above is unable to reflect the current temperature. It drops down the reliability of data or it induces the excessive power consumption. This is because the driving of the temperature sensing device can be performed together with the driving of other devices within the semiconductor memory device. As a result, an error can occur in the temperature value due to the noise which is generated by the driving of other circuits.

A voltage unstable situation, such as a voltage drop, a ringing phenomenon or oscillation, is generated by the current and voltage consumption according to the operations of the devices. When the sensed temperature is converted into the digital value, an error is caused by the fluctuation which is generated by the unstable voltage or current.

As to the refresh in which a cycle is determined by the temperature value of a device, the refresh is unable to be performed in an appropriate cycle due to the erroneous temperature value. This inappropriate refresh can cause a loss of the stored data and reduce the reliability of the memory device. Furthermore, the excessive refresh induces the unnecessary power consumption.

A semiconductor memory device is generally manufactured with a RAS timing having a predetermined value according to an initial design of configuration. However, after the semiconductor memory device is manufactured, the refresh operation may be performed differently, compared with the initial design. At this time, the predetermined RAS timing can be too long or short for the semiconductor memory device to perform the refresh operation. If the RAS timing is too long, a refresh operation time also increases and too much current is consumed. On the other hand, if the RAS timing is too short, the refresh operation is not performed sufficiently and the-stored data are lost.

SUMMARY OF THE INVENTION

Embodiments of the present invention are directed to providing a semiconductor memory device capable of measuring a temperature without the influence of noise.

In accordance with an aspect of the present invention, a semiconductor memory device includes a temperature sensing device for sensing a current temperature in response to a control signal, wherein the semiconductor memory device enters a power save mode for a predetermined time starting from an activation of the control signal and wherein the power save mode has substantially no power consumption.

In accordance with another aspect of the present invention, a method for driving a semiconductor memory device includes sensing a current temperature in response to a control signal and entering a power save mode for a predetermined time starting from an activation of the control signal, wherein the power save mode has substantially no power consumption.

In accordance with further aspect of the present invention, a semiconductor memory device includes a counting means for counting inputs of a control signal and for outputting an internal control signal based on the number of predetermined times the control signal is inputted, and a temperature sensing device to sense a current temperature in response to the internal control signal during a non-active mode, wherein the semiconductor memory device enters a power save mode for a predetermined time starting from an activation of the internal control signal and wherein the power save mode has substantially no power consumption.

In accordance with further aspect of the present invention, a method for driving a semiconductor memory device includes counting the number of times control signals are inputted, sensing a current temperature when the number of times the control signals are inputted, and entering a power save mode for a predetermined time within the sensing the current temperature, wherein the power save mode has substantially no power consumption.

DESCRIPTION OF SPECIFIC EMBODIMENTS

As apparent from the present invention, a temperature sensing device can measure an exact temperature without a noise, by minimizing power consumption generated in a circuit during its driving. Moreover, since a refresh operation is steadily performed through a temperature value having no error and data are not lost, the reliability of a device is improved. Further, since the number of times the temperature sensing device is driven can be selected, power consumption which is caused by an unnecessary driving of the temperature sensing device can be reduced.

Hereinafter, a semiconductor memory device in accordance with the present invention will be described in detail referring to the accompanying drawings.

Figure 2:
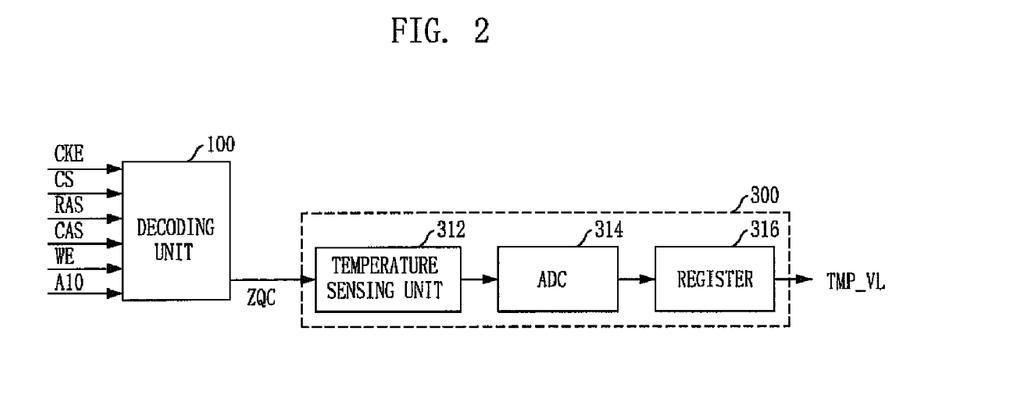
FIG. 2 is a block diagram of a semiconductor memory device according to one embodiment of the present invention.

FIG. 2 is a block diagram of a semiconductor memory device according to one embodiment of the present invention. Referring to FIG. 2, the semiconductor memory device according to one embodiment of the present invention includes a decoding unit 100 to decode a plurality of external command signals CKE, CS, RAS, CAS and WE and to produce a control signal ZQC based on the decoding operation, and a temperature sensing device 300 to sense a current temperature in response to the control signal ZQC. Further, in the whole section or the partial section of the driving of the temperature sensing device 300, the memory which is controlled by a chip set can be in a power down mode or an idle state where there is no access to the memory core, but not in an active mode where access to the memory core is performed. Meanwhile, being different from the above-mention operation, even the power down mode can not be allowed in the whole section or the partial section of the driving of the temperature sensing device 300.

Particularly, the memory typically has an active mode, such as a read mode, a write mode, a refresh mode or a precharge mode, with access to the memory core and a power down mode or an idle state without access to the memory core. In the present invention, the power down mode or the idle state, but not the active mode, can be guaranteed in the whole section or the partial section of the driving of the temperature sensing device, or only the idle state, but not the active mode or the power down mode, can be guaranteed in the above-mentioned driving section of the temperature sensing device.

The temperature sensing device 300 includes a temperature sensing unit 312 to sense the current temperature in response to the control signal ZQC, an ADC 314 to convert the analog signal from the temperature sensing unit 312 into a digital signal, and a register 316 to store an output signal from the ADC 314.

On the other hand, in the preferred embodiment of the present invention, a ZQC signal is used as a control signal which is introduced in JEDEC specification to describe DDR3 SDRAM. The memory device to which the ZQC signal is applied is driven by the impedance matching of ODT (On Die Termination) or OCD (Off Chip Driver) which almost never causes the power consumption.

While the use of a ZQC signal as a control signal is described herein, it is possible to use other control signals, instead of the ZQC signal. The most importance is to make the idle state and/or the power down mode, in which the memory controlled by a chip set almost never causes the power consumption in at least one section while the temperature sensing device is driven. Accordingly temperature sensing operation of the present invention is carried out more stably than that of the conventional memory device in this section where the power consumption is almost not created.

The operation of the semiconductor memory device according to the present invention will be described in detail.

First, the decoding unit 100 decodes the external command signals CKE, CS, RAS, CAS and WE and activates the control signal ZQC.

Subsequently, the temperature sensing unit 312 senses the current temperature during the section where the control signal ZQC is activated. The ADC 314 converts the analog signal from the temperature sensing unit 312 into a digital signal and outputs the digital signal. The register 316 stores the output signal from the ADC 314 as a temperature value TMP_VL.

In the above-mentioned semiconductor memory device according to the present invention, the memory device drives the temperature sensing device without a noise so that there is no error in the sensed temperature, by maintaining the idle state (or the power down mode, selectively) for a predetermined time the temperature sensing device 300 is driven.

Figure 3:
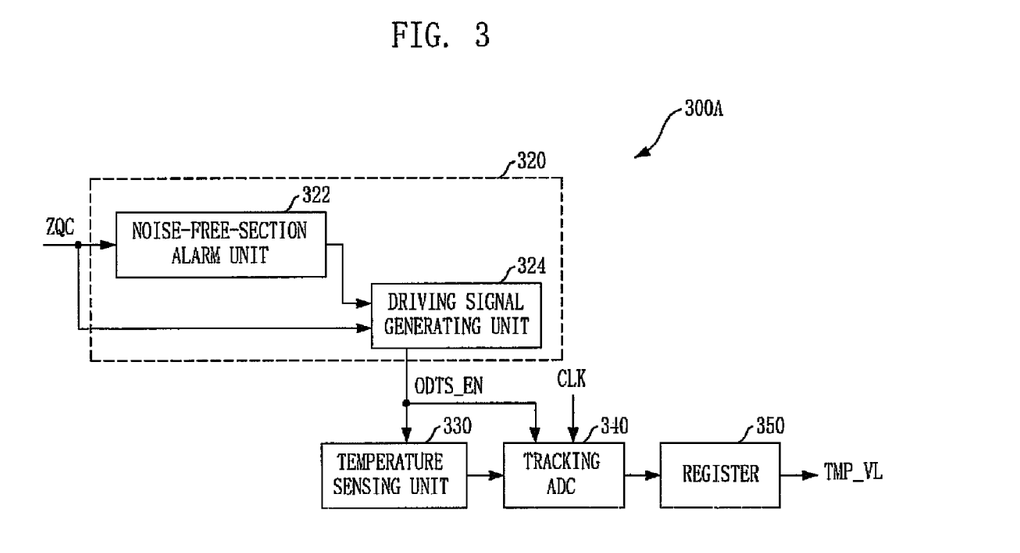
FIG. 3 is a block diagram of a temperature sensing device having a tracking ADC.

Meanwhile, a temperature sensing device 300A having a tracking ADC will be described below in detail.

FIG. 3 is a block diagram illustrating the temperature sensing device 300A having the tracking ADC.

Referring to FIG. 3, the temperature sensing device 300A includes: a driving control unit 320 to activate the driving signal ODTS_EN in response to the control signal ZQC and to maintain it until a new control signal ZQC is applied to itself; a temperature sensing unit 330 to sense the current temperature in response to the driving signal ODTS_EN; a tracking ADC 340 to track an analog output value from the temperature sensing unit 330 on a clock-by-clock basis when the driving signal ODTS_EN is activated and to convert the analog signal into a digital signal; and a register 350 to store the output value from the tracking ADC 340 and to output it as the temperature value TMP_VL.

The driving control unit 320 includes a noise-free-section alarm unit 322 to receive the control signal ZQC and to produce a noise-free-section signal for informing a non-active section, and a driving signal generating unit 324 to activate the driving signal ODTS_EN after a predetermined time from the activation of the control signal ZQC and to inactivate the driving signal ODTS_EN in response to the noise-free-section signal.

The time the driving signal ODTS_EN is activated by the activation of the control signal ZQC is slower than the time the noise-free-section signal, which is produced by the same control signal ZQC, is inactivated. Accordingly, the driving signal ODST_EN is activated after the control signal ZQC is applied and it is inactivated when the noise-free-section signal is inactivated by the new control signal ZQC.

The noise-free-section alarm unit 322 includes a counter or a ring oscillator and maintains the activation of the control signal ZQC for a predetermined time.

The operation of the temperature sensing device shown in FIG. 3 will be described below in detail.

First, the driving signal generating unit 324 activates the driving signal ODTS_EN after a predetermined time from the activation of the control signal ZQC. Subsequently, the temperature sensing unit 330 and the tracking ADC 340 sense the current temperature during the activation of the driving signal ODTS_EN and output the sensed temperature in a digital level. The register 350 stores the output signal of the tracking ADC 340 and outputs the stored signal as the temperature value TMP_VL. Next, when the second control signal ZQC is newly applied to the driving control unit 320, the noise-free-section alarm unit 322 outputs the noise-free-section signal of which the activation is maintained for a predetermined time starting from the activation of the control signal ZQC. In the activation section of the noise-free-section signal, the semi-conductor memory device is controlled in order that it is maintained in the idle state and/or the power down mode. The driving signal generating unit 324 inactivates the driving signal ODTS_EN in response to the nonactivation of the noise-free-section signal. Accordingly, the temperature sensing unit 330 and the tracking ADC 340 are terminated. After a predetermined time, the driving signal generating unit 324 activates another driving signal ODTS_EN in response to the second control signal ZQC which is newly applied to the driving control unit 3.20 and repeats the operation set forth above. For reference, the tracking ADC 340 can not receive the driving signal ODTS_EN. In this case, the tracking ADC 340 continuously tracks the output values from the temperature sensing unit 330 on a clock-by-clock basis.

As mentioned above, the semiconductor memory device shown in FIG. 3 outputs an exact temperature value, by driving the temperature sensing device having the tracking ADC when it enters the idle sate or the power down mode for a predetermined time starting from the activation of the control signal.

Figure 4:
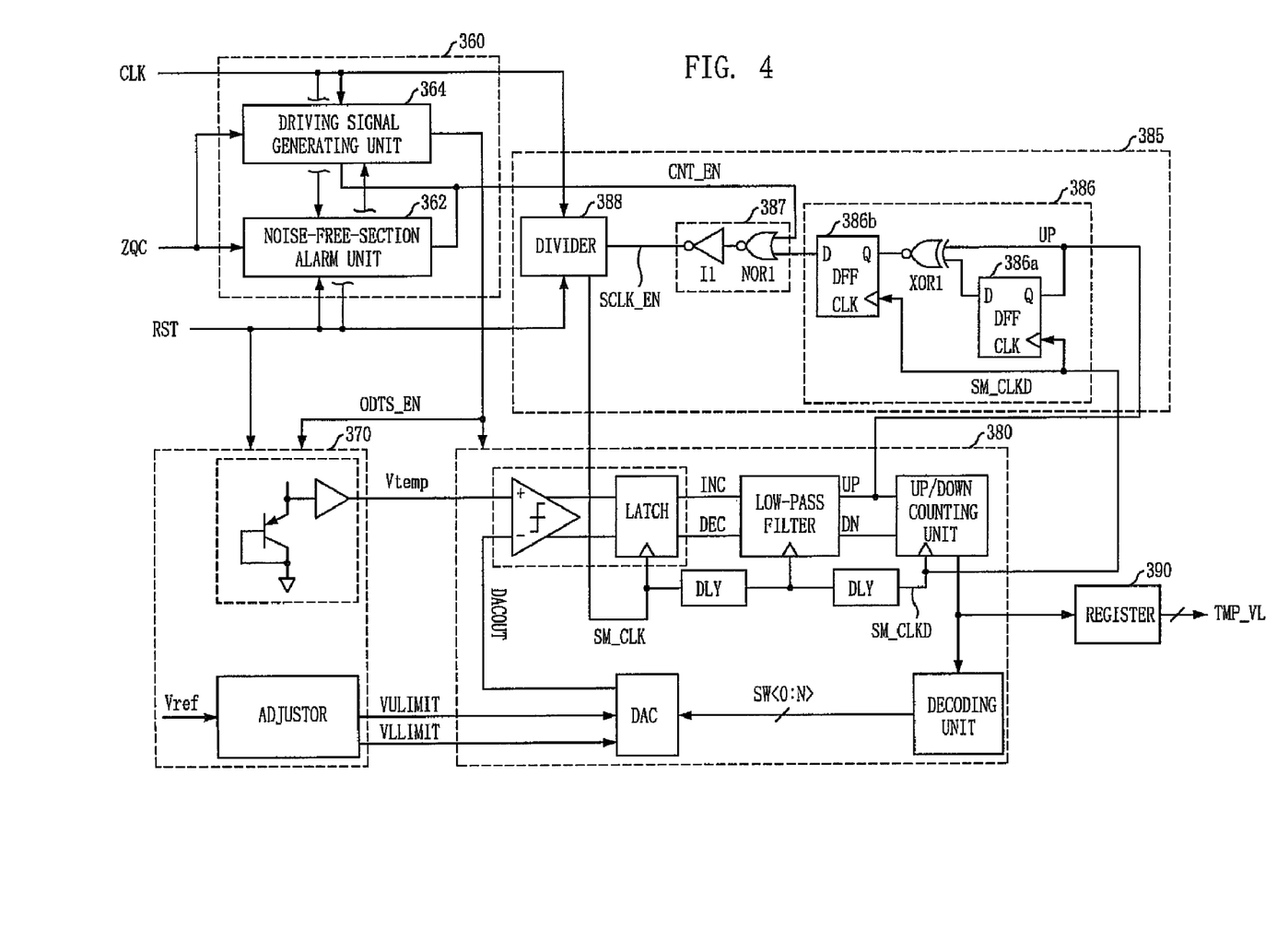
FIG. 4 is a block diagram of the temperature sensing device to drive the tracking ADC based on variation in temperature.

On the other hand, the temperature sensing device further including an ADC driving control unit to control the tracking ADC based on variation of the sensed temperatures will be described accompanying the drawings.

FIG. 4 is a block diagram of the temperature sensing device to drive the tracking ADC based on variation in temperature.

Referring to FIG. 4, the temperature sensing device includes: a driving control unit 360 having a noise-free-section alarm unit 362 to receive the control signal ZQC and to produce a noise-free-section signal CNT_EN for informing a non-active section and a driving signal generating unit 364 to activate a driving signal ODTS_EN after a predetermined time starting from the activation of the control signal ZQC and to inactivate the driving signal ODTS_EN in response to the noise-free-section signal CNT_EN; a temperature sensing unit 370 to sense the current temperature in response to the driving signal ODTS_EN; a tracking ADC 380 to convert an analog signal from the temperature sensing unit 370 into a digital value in response to driving signal ODTS_EN and a sample clock signal SM_CLK; a tracking control unit 385 to provide the sample clock signal SM_CLK using a clock signal in response to a level signal UP from the tracking ADC 380 and the noise-free-section signal CNT_EN; and a register 390 to store the output from the tracking ADC 380 and to output it as a temperature value TMP_VL.

Further, the tracking control unit 385 includes: a level change detecting unit 386 to receive the level signal UP, to sense the change of the level, and then to output a level change signal; a dividing control unit 387 to produce a divider driving signal SCLK_EN in response to the level change signal or the activation of the noise-free-section signal CNT_EN; and a divider 388 to produce the sample clock signal SM_CLK by dividing the clock signal at the time of the activation of the divider driving signal SCLK_EN.

On the other hand, the tracking control unit 385 can supply the clock signal to the tracking ADC 380 by controlling the supply of the clock signal using the divider driving signal SCLK_EN without having the divider 388.

Also, the level change detecting unit 386 includes: a flip-flop 386a for receiving the level signal UP in synchronization with a delayed sample clock signal SM_CLKD; an XOR logic gate XOR1 to receive the output signal of the flip-flop 386a and the level signal UP; and a flip-flop 386b to receive the output signal of the XOR logic gate XOR1 in synchronization with the delayed sample clock signal SM_CLKD and to output the level change signal. The delayed sample clock signal SM_CLKD is produced by delaying the sample clock signal SM_CLK in the tracking ADC 380.

The dividing control unit 387 includes a NOR gate NOR1 to receive the level change signal and the noise-free-section signal CNT_EN and an inverter I1 to invert the output signal of the NOR gate NOR1 and to output it as the divider driving signal SCLK_EN.

The driving control unit 360, the temperature sensing unit 370, the tracking ADC 380 and the divider 388 are initialized by a reset signal RST. Here, the reset signal RST is applied to them at the initial driving of the device. Also, the driving signal generating unit 364 includes a timer and the noise-free-section alarm unit 362 includes a counter.

Figure 5:
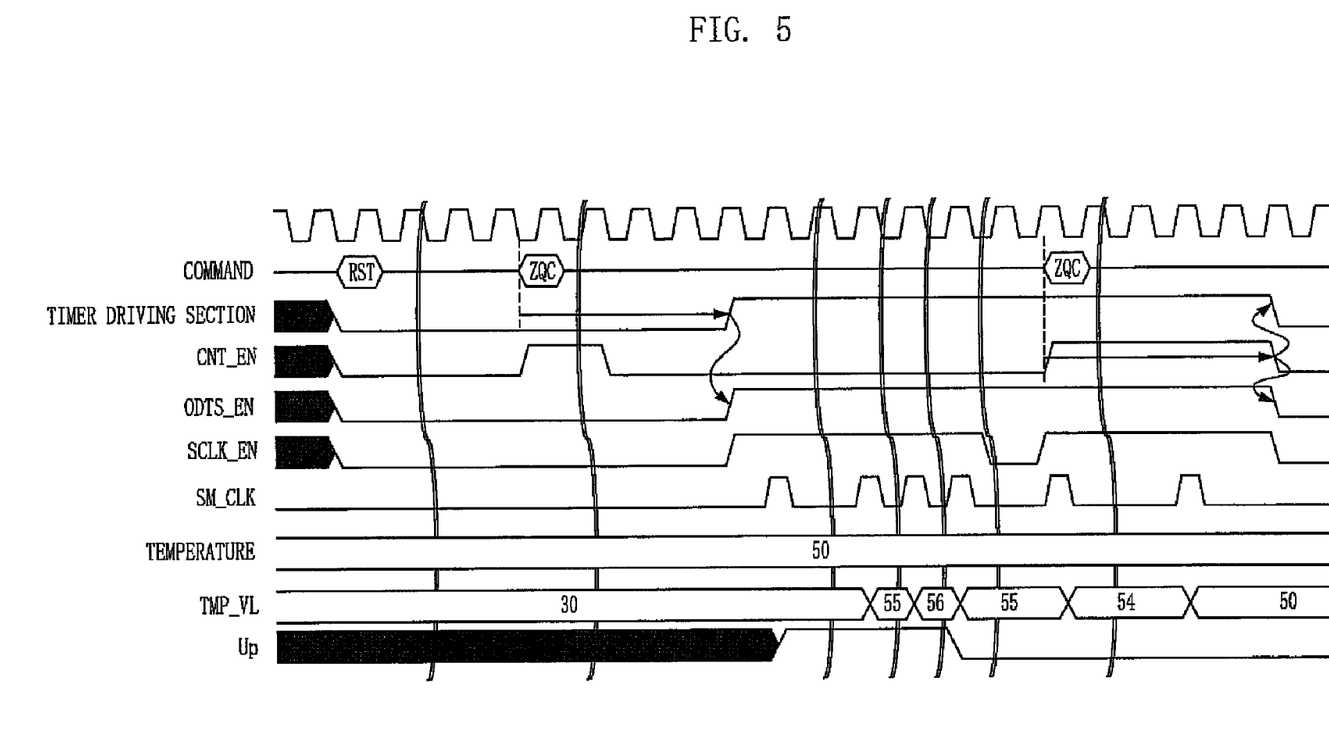
FIG. 5 is a waveform illustrating an operation of the temperature sensing device in FIG. 4.

FIG. 5 is a waveform illustrating an operation of the temperature sensing device in FIG. 4. Referring to FIG. 5, all the blocks in the temperature sensing device are initialized by the reset signal RST which is applied to the device at the time of initial driving of the device.

Subsequently, when the control signal ZQC is applied to the temperature sensing device, the driving signal generating unit 364 produces the driving signal ODTS_EN after a predetermined time which is set up by the counter therein. Next, the temperature sensing unit 370 senses the current temperature in response to the activation of the driving signal ODTS_EN. The tracking ADC 380 tracks the output values of the temperature sensing unit 370 on a clock-by-clock basis of the sample clock signal SM_CLK while the driving signal ODTS_EN is activated and converts them into digital values. At this time, since all the blocks in the tracking ADC 380 are driven in a loop type on a clock-by-clock basis of the sample clock signal SM_CLK, one loop circulation can track the output value of the temperature sensing unit 370 on a unit basis of 1° C. Therefore, in the case where the current temperature is 50° C. and the stored temperature in the register 390 is 30° C., the loop circulation is repeatedly required to store the temperature of 50° C. in the register 390 and the number of times the loop circulation is required is 20.

However, the temperature value TMP_VL of 55° C. or 56° C., which is higher than the current temperature 50° C., is stored in the register 390. The reason why the higher temperature is stored in the register 390 is that the power consumption is created in the other circuit blocks in a state where the noise-free-section signal CNT_EN is inactivated and this noise affects both the temperature sensing unit 370 and the tracking ADC 380.

Meanwhile, as mentioned above, when the temperature of the temperature sensing unit 370 is stored in the register 390 through the temperature tracking operation, the level signal UP is inactivated. Accordingly, the level change detecting unit 386 and the dividing control unit 387 inactivate the divider driving signal SCLK_EN so that the sample clock signal SM_CLK is not supplied by the divider 388. Since the sample clock signal SM_CLK is not supplied to the tracking ADC 380, the operation of the tracking ADC 380 is terminated. Thereafter, a new control signal ZQC is applied to the temperature sensing device.

Subsequently, the noise-free-section alarm unit 362 activates the noise-free-section signal CNT_EN which is activated for a predetermined time by the activation of the control signal ZQC. Next, the dividing control unit 387 activates the divider driving signal SCLK_EN in response to the activation of the noise-free-section signal CNT_EN and the divider 388 divides a clock signal CLK while the divider driving signal SCLK_EN is activated and then outputs the divided clock signal as the sample clock signal SM_CLK.

On the other hand, the semiconductor memory device is maintained, by the chip set, in the idle state and/or the power down mode for a predetermined time starting from the activation of the noise-free-section signal. Accordingly, the temperature sensing unit 370 and the tracking ADC 380 sense the current temperature in a state where a noise is not produced by the power consumption and store in the register 390 the temperature value TMP_VL corresponding to the current temperature of 50° C. Further, the driving signal generating unit 364 inactivates the driving signal ODTS_EN in response to the nonactivation of the noise-free-section signal CNT_EN. Finally, the operation of the temperature sensing unit 370 and the tracking ADC 380 is terminated.

The driving of the temperature sensing device having the tracking ADC shown in FIGS. 3 and 4 can be classified into a coarse measurement mode and a precise measurement mode based on the control signal ZQC.

In other words, the coarse measurement mode is defined as a section in which the noise-free-section signal CNT_EN is inactivated during the activation of the driving signal ODTS_EN and the precise measurement mode is defined as a section in which the noise-free-section signal CNT_EN is activated during the activation of the driving signal ODTS_EN. In the section where the noise-free-section signal CNT_EN is inactivated, since the temperature sensing unit and the tracking ADC are driven in a state where a noise is generated by the power consumption of the semiconductor memory device, the current temperature is sensed with an error which is created by a noise. However, in the section where the noise-free-section signal CNT_EN is activated, since the semiconductor memory device is maintained in the idle state and/or the power down mode, the temperature sensing unit and the tracking ADC contribute to the sensing operation of the current temperature without noise.

As mentioned above, the reason why the operation section of the temperature sensing device is classified into the coarse measurement mode and the precise measurement mode is that it is not possible to keep the idle state and/or the power down mode of the semiconductor memory device for a long time in the entire operation thereof. Furthermore, since it takes a predetermined time to turn on the temperature sensing device and to stabilize the power, it is necessary to classify the measurement mode. That is, it is possible to shorten the idle state and/or the power down mode of the semiconductor memory device through the coarse measurement mode.

Meanwhile, if the temperature sensing device 300 is driven whenever the control signal ZQC is applied to it, the power consumption may be generated unnecessarily. Particularly, in the case where the control signal ZQC is periodically produced with a constant interval, the temperature sensing device 300, which is driven whenever the control signal ZQC is applied, may have an ineffectiveness, considering that it takes a few seconds to tens of seconds to have a temperature change of 1° C. Accordingly, a semiconductor memory device, which senses the temperature without noise and has minimum power consumption, will be described referring to the accompanying drawings.

Figure 6:
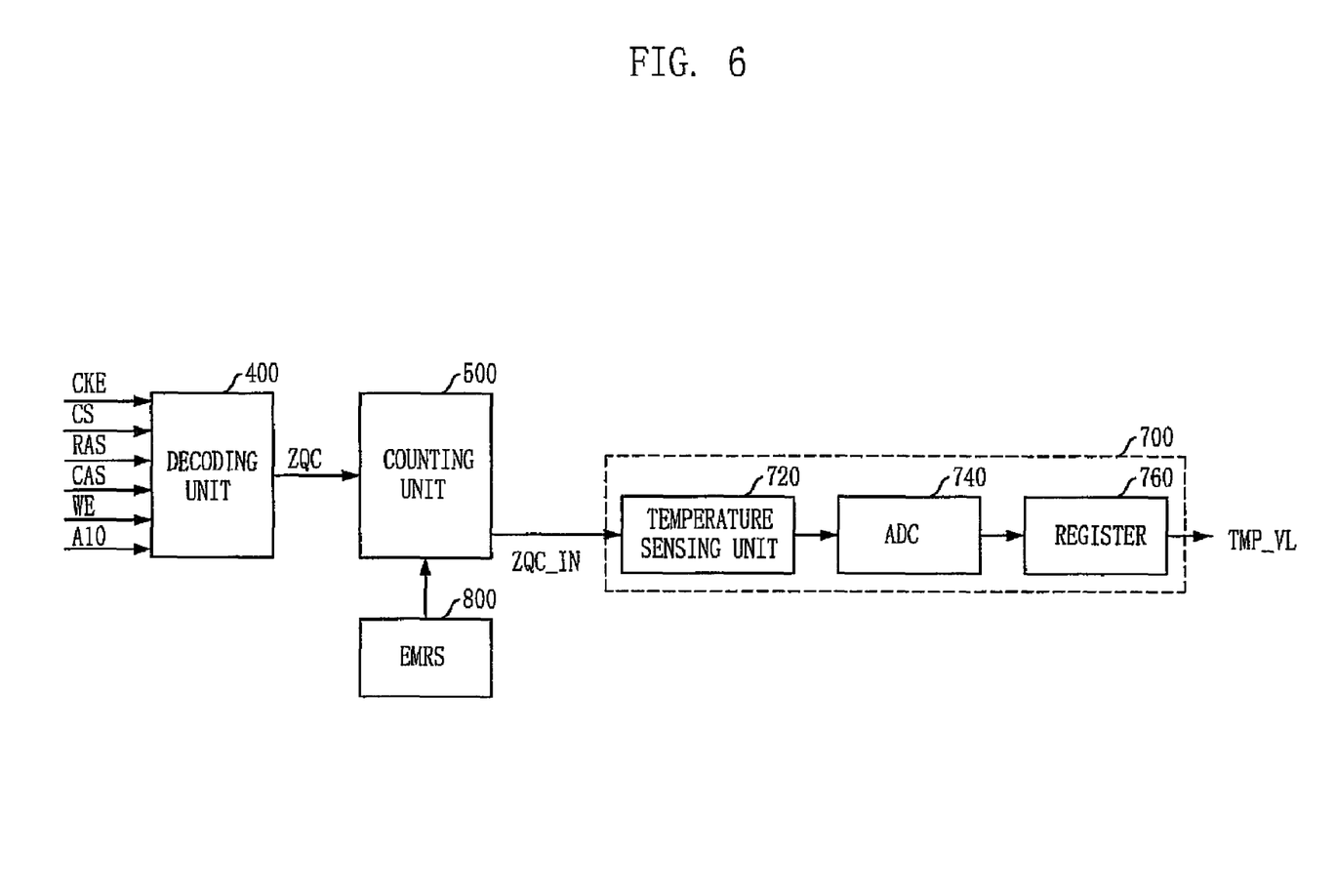
FIG. 6 is a block diagram of a semiconductor memory device according to another embodiment of the present invention.

FIG. 6 is a block diagram of a semiconductor memory device according to another embodiment of the present invention.

Referring to FIG. 6, the semiconductor memory device according to another embodiment of the present invention includes a decoding unit 400 to decode a plurality of external command signals CKE, CS, RAS, CAS and WE and to produce a control signal ZQC based on the decoding operation, a counting unit 500 to count the number of times the control signal ZQC is activated and then to output an internal control signal ZQC_IN, and a temperature sensing device 700 to sense a current temperature in response to the internal control signal ZQC_IN.

Here, the counting unit 500 counts a set value to assign the predetermined number of times the control signal ZQC is inputted and the set value can be controlled by a mode register 800. Also, the temperature sensing device 700 includes a temperature sensing unit 720 to sense the current temperature in response to the internal control signal ZQC_IN, an ADC 740 to convert an analog signal from the temperature sensing unit 720 into a digital value, and a register 760 to store the output from the ADC 740 and to output it as a temperature value TMP_VL.

Figure 7:
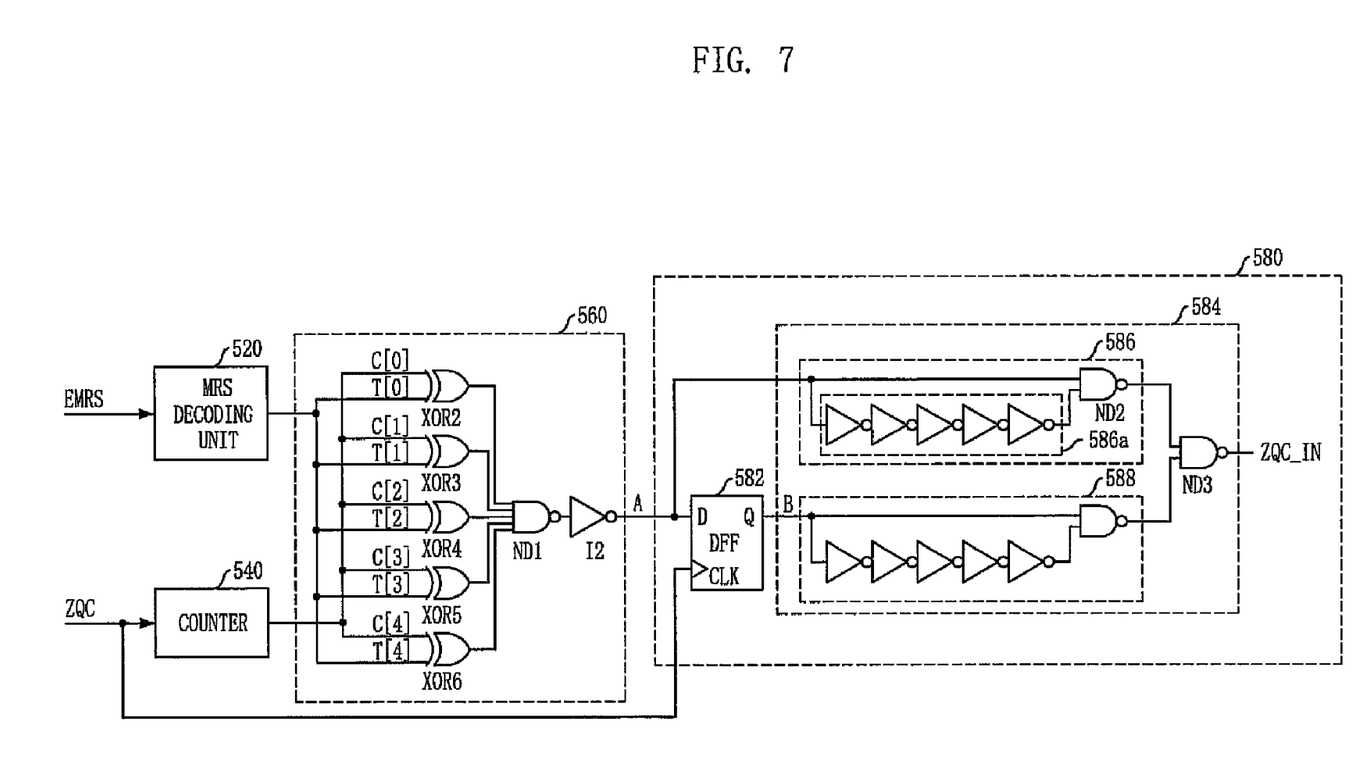
FIG. 7 is an internal circuit diagram illustrating a counting unit in FIG. 6.

FIG. 7 is an internal circuit diagram illustrating the counting unit 500 in FIG. 6. Referring to FIG. 7, the counting unit 500 includes a MRS (Mode Register Set) decoding unit 520 to decode values which are set in the mode register 800 and to output a plurality of setup signals (T[0:4]), a counter 540 to count the number of times the control signal is inputted and to output a counting signal (C[0:4]), a comparison unit 560 to activate an output signal (A) when the setup signal is the same as the counting signal (C[0:4]), and an internal control signal generating unit 580 to receive an output signal (A) of the comparison unit 560 in response to the control signal ZQC and then to produce the internal control signal ZQC_IN.

The comparison unit 560 includes first to fifth XNOR logic gates XNOR1, XNOR2, XNOR3, XNOR4 and XNOR5 which respectively receive both one of the plurality of setup signals from the MRS decoding unit 520 and one of the plurality of counting signals from the counter 540, a NAND gate ND1 to receive output signals of the first to fifth XNOR logic gates XNOR1, XNOR2, XNOR3, XNOR4 and XNOR5, and an inverter 12 to invert an output signal of the NAND gate ND1.

The internal control signal generating unit 580 includes a flip-flop 582 for receiving the output signal (A) of the comparison unit 560 in response to the control signal ZQC and a signal generating unit 584 to sense a point of time the output signal (A) of the comparison unit 560 or an output signal (B) of the flip-flop 582 is activated and then to output the internal control signal ZQC_IN.

The signal generating unit 584 includes a first rising-edge detection unit 586 for sensing a rising edge of the output signal (A) of the comparison unit 560, a second rising-edge detection unit 588 for sensing a point of time the output signal (B) of the flip-flop 582 is activated, and an output part (NAND gate) ND3 for outputting the internal control signal ZQC_IN as an output signal when the output signal of the first or second rising-edge detection unit 586 or 588 is activated.

Since the first and second rising edge detecting units 586 and 588 have the same structure, only the first rising edge detecting unit 586 will be describe in detail.

The first rising edge detecting unit 586 includes an inverter chain 586a to delay and invert the output signal (A) of the comparison unit 584 and a NAND gate ND2 to receive output signals of the inverter chain 586a and the comparison unit 584.

The output part ND3 includes a NAND gate to receive the output signals of the first and second rising edge detecting units 586 and 588 and then to output the internal control signal ZQC_IN.

The semiconductor memory device shown in FIGS. 6 and 7 further includes the counting unit 500 so that the temperature sensing device 700 is driven when the control signal ZQC is applied thereto a predetermined number of times. Since the temperature sensing device 700 is not driven whenever the control signal ZQC is applied thereto, but it is driven when the command signals are inputted over the predetermined numbers, it is possible to reduce the power consumption.

Since the semiconductor memory device according to another embodiment of the present invention applies the internal control signal ZQC_IN, instead of the control signal ZQC, to the temperature sensing device in FIGS. 3 and 4, the reduction of the power consumption can be achieved. Since only external control signal is replaced with the internal control signal, the driving operation will be described without illustrating the entire circuitry of the temperature sensing device.

Figure 8:
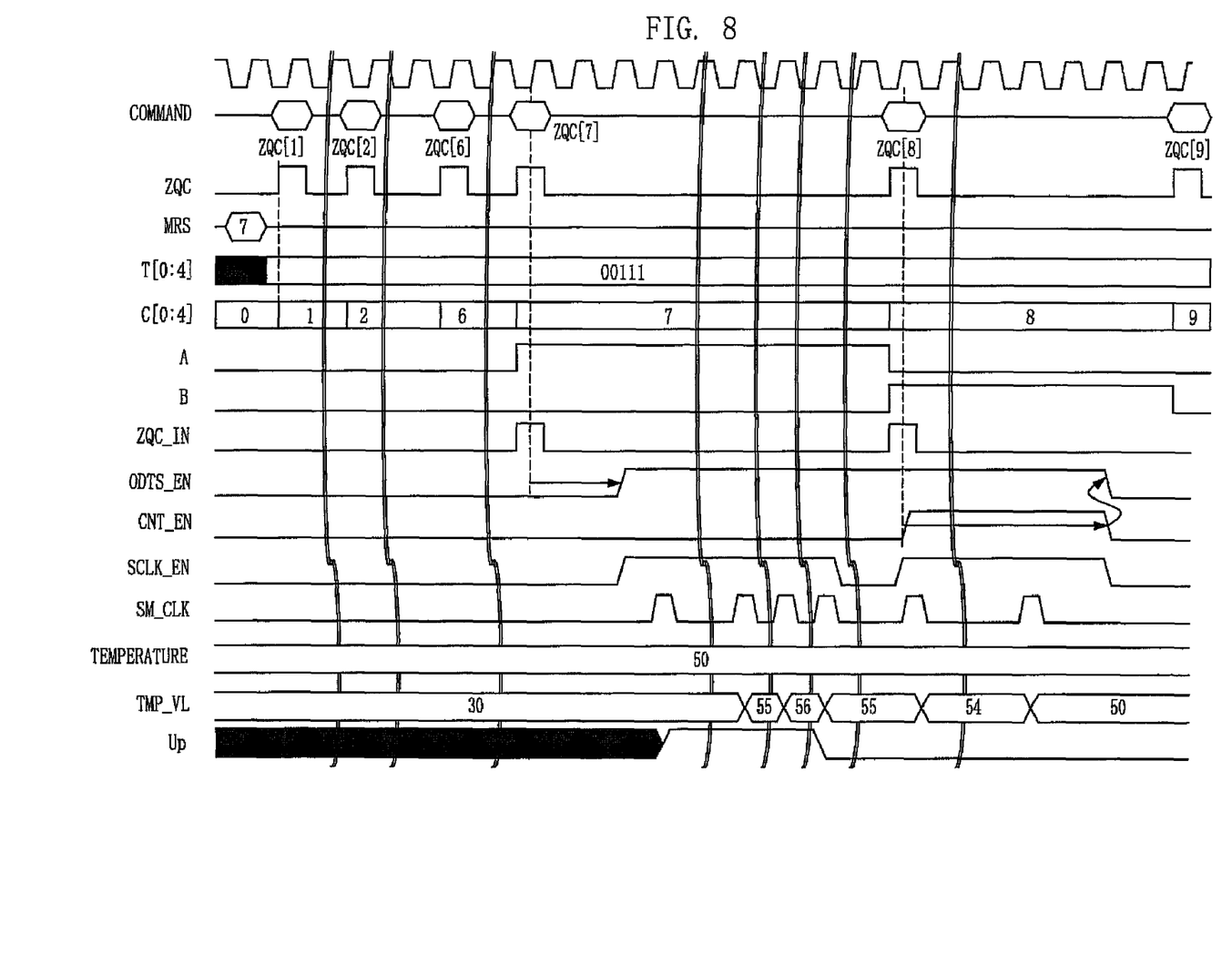
FIG. 8 is a waveform illustrating an operation of the semiconductor memory device according to another embodiment of the present invention.

FIG. 8 is a waveform illustrating the operation of the semiconductor memory device according to another embodiment. Since it has the same configuration as the circuitry of the temperature sensing device which controls the driving of the tracking ADC in FIG. 5, the reference numerals shown in FIG. 5 are referred to in illustrating the operation of the semiconductor memory device.

As shown in FIG. 5, assuming that '7' is stored in the mode register 800, the MRS decoding unit 520 decodes the values which are stored in the mode resister 800 and outputs a plurality of signals T[0:4] which are preset as '11100'. Next, the counter 540 increase the counting signal C [0:4] one-by-one whenever the control signal ZQC is activated. When the counting signal C [0:4] is the same as the preset signal T [0:4], the comparison unit 560 activates an output signal. The internal control signal generating unit 580 activates the internal control signal ZQC_IN in synchronization with the activation of the output signal of the comparison unit 560. Since the internal control signal ZQC_IN is not activated until the seventh control signal ZQC is inputted, the temperature sensing device 700 is not driven. Next, the driving signal generating unit 364 activates the driving signal ODTS_EN in response to the activation of the internal control signal after ZQC_IN after a predetermined time.

Next, the temperature sensing unit 370 senses the current temperature in response the activation of the driving signal ODTS_EN. The tracking ADC 380 tracks the output values of the temperature sensing unit 370 on a clock-by-clock basis of the sample clock signal SM_CLK while the driving signal ODTS_EN is activated and converts them into digital values. When the noise-free-section signal CNT_EN is inactivated, the temperature stored in the register 390 is 55° C. or 56° C., which is higher than the current temperature 50° C.

Meanwhile, as the mentioned above, when the temperature of the temperature sensing unit 370 is stored in the register 390 through the temperature tracking operation, the level signal UP is inactivated. Accordingly, the level change detecting unit 386 and the dividing control unit 387 inactivate the divider driving signal SCLK_EN so that the sample clock signal SM_CLK is not supplied by the divider 388. Since the sample clock signal SM_CLK is not supplied to the tracking ADC 380, the operation of the tracking ADC 380 is terminated. Thereafter, when the eight control signal ZQC is applied to the temperature sensing, the flip-flop 582 in the internal control signal generating unit 580 stores the output signal of the comparison unit 560 in the eight control signal ZQC. Accordingly, the signal generating unit 584 activates the internal control signal ZQC_IN at the time of the activation of the output signal of the flip-flop 582.

Subsequently, the noise-free-section alarm unit 362 activates the noise-free-section signal CNT_EN which is activated for a predetermined time by the activation of the control signal ZQC. Next, the dividing control unit 387 activates the divider driving signal SCLK_EN in response to the activation of the noise-free-section signal CNT_EN and the divider 388 divides a cock signal CLK while the divider driving signal SCLK_EN is activated and then outputs the divided clock signal as the sample clock signal SM_CLK.

On the other hand, the semiconductor memory device is maintained, by the chip set, in the idle state and/or the power down mode during the activation of the noise-free-section signal. Accordingly, the temperature sensing unit 370 and the tracking ADC 380 sense the current temperature in a state where a noise is not produced by the power consumption and stores in the register 390 the temperature value TMP_VL corresponding to the current temperature of 50° C. Further, the driving signal generating unit 364 inactivates the driving signal ODTS_EN in response to the nonactivation of the noise-free-section signal CNT_EN. Finally, the operation of the temperature sensing unit 370 and the tracking ADC 380 is terminated.

The internal control signal ZQC_IN is activated when the control signal ZQC is applied to it seven times. The number of times the control signal ZQC is inputted can be changed by a preset value stored in the mode register 800.

As described above, in the case where the control signal is applied over the predetermined number of inputs, the operation of the temperature sensing device in the semiconductor memory device according to the second embodiment of the present invention is terminated. Therefore, the power consumption due to the frequent driving can be reduced. Also, in another embodiment of the present invention, if the internal control signal is applied, the temperature sensing device enters the power down mode and/or the idle state for the predetermined time so that the current temperature is exactly measured without noise.

On the other hand, since the semiconductor memory device equipped with the temperature sensing device according to the present invention enters the power down mode and/or the idle state for a predetermined time starting from the activation of the control signal, the temperature sensing device exactly measures the current temperature without noise which is issued by the power consumption. In this way, since the current temperature which has influence on the refresh is exactly obtained, the reliability of the device is improved with low power consumption.

Besides, since the temperature sensing device runs when the control signal is applied over the predetermined number of the inputs, the power consumption due to the frequent driving can be reduced.

In the meantime, the tracking ADC is exemplarily illustrated in the above-mentioned present invention. However, since the error from the unstable voltage or current can be generated in all ADCs, the present invention is not limited to a specific ADC, including the tracking ADC.

While the present invention has been described with respect to the particular embodiments, it will be apparent to those skilled in the art that various changes and modifications may be made without departing from the spirit and scope of the invention as defined in the following claims.

What is claimed is:

1. A method for driving a semiconductor memory device comprising:
   sensing a current temperature in response to a control signal; and
   entering a power save mode for a predetermined time starting from an activation of the control signal, wherein during the power save mode, the semiconductor memory device has reduced power consumption.

2. The method of claim 1, wherein the power save mode is an idle state or a power down mode.

3. The method of claim 1, wherein the power save mode is a non-access mode in which a memory core is not accessed.

4. The method of claim 1, wherein the control signal controls an impedance matching of ODT (On Die Termination) or OCD (Off Chip Driver) for a predetermined time.

5. The method of claim 1, wherein the sensing a current temperature includes:
   sensing an analog level signal corresponding to the current temperature; and
   outputting a digital signal corresponding to the analogue level signal.

6. The method of claim 5, wherein the outputting a digital signal includes:
   detecting a difference between the sensed analog level signal and the digital signal; and
   tracking the sensed analogue level signal when the difference occurs or during a first section.

7. A semiconductor memory device comprising:
   a counting means for counting inputs of a control signal and for outputting an internal control signal based on the number of predetermined times the control signal is inputted; and
   a temperature sensing device to sense a current temperature in response to the internal control signal during a non-active mode,
   wherein the semiconductor memory device enters a power save mode for a predetermined time starting from an activation of the internal control signal and wherein during the power save mode, the semiconductor memory device has reduced power consumption.

8. The semiconductor memory device of claim 7, wherein the power save mode is an idle state or a power down mode.

9. The semiconductor memory device of claim 7, wherein the power save mode is a non-access mode in which a memory core is not accessed.

10. The semiconductor memory device of claim 7, wherein the control signal controls an impedance matching of ODT (On Die Termination) or OCD (Off Chip Driver) for a predetermined time.

11. The semiconductor memory device of claim 7, further comprising a mode register to set the predetermined time the control signal is inputted.

12. The semiconductor memory device of claim 11, wherein the counting means includes:
   a MRS decoding means for decoding a value which is set in the mode register and outputting a plurality of set-up signals;
   a counter to count the number of times the control signal is inputted and then outputting a plurality of counting signals;
   a comparison means for activating an output signal when the set-up signal and the counting signal have the same value; and
   an internal control signal generating means for producing the internal control signal using an output signal of the comparison means in response to the control signal.

13. The semiconductor memory device of claim 12, wherein the temperature sensing device includes:
   a temperature sensor to sense the current temperature in response to the internal control signal;
   an AD (Analog to Digital) converting means for converting an analog signal from the temperature sensor into a digital signal; and
   a storage means for storing an output signal of the AD converting means and outputting the stored signal as a temperature value.

14. The semiconductor memory device of claim 13, wherein the comparison means includes:
   a plurality of exclusive-NOR logic gates, each of which receives one of the plurality of set-up signals and one of the plurality of counting signals;
   a first NAND gate for performing a NAND operation to output signals of the plurality of exclusive-NOR logic gates; and
   a first inverter for inverting an output signal of the first NAND gate.

15. The semiconductor memory device of claim 14, wherein the internal control signal generating means includes:
   a flip-flop for receiving the output signal of the comparison means in response to the control signal; and
   a signal generating means for outputting the internal control signal by sensing an activation of the output signal of the comparison means or the flip-flop.

16. The semiconductor memory device of claim 15, wherein the signal generating means includes:
   a first edge detecting means for detecting the activation of the output signal of the comparison means;
   a second edge detecting means for the activation of the output signal the flip-flop; and
   an output means for outputting the internal control signal when output signals of the first and second first edge detecting means are activated.

17. The semiconductor memory device of claim 16, wherein the first and second edge detecting means respectively include:
- an inverter chain for delaying and inverting an input signal; and
- a second NAND gate for performing a NAND operation to an output signal of the inverter chain and the input signal.

18. The semiconductor memory device of claim 17, wherein the output means includes a NAND gate which receives output signals of the first and second edge detecting means and then outputs the internal control signal.

19. The semiconductor memory device of claim 18, further comprising a decoding means for decoding a plurality of external command signals and outputting the control signal.

20. A semiconductor memory device comprising:
- a counting means for counting inputs of a control signal and for outputting an internal control signal when the number of times the control signals are inputted;
- a driving control means for activating a driving signal in response to a control signal and maintaining the activation of the driving signal until a subsequent control signal is inputted;
- a temperature sensor for sensing a current temperature in response to the driving signal;
- a tracking AD (Analog to Digital) converting means for tracking an analog signal from the temperature sensor into a digital signal on a clock-by-clock basis and converting the tracked analog signal into a digital signal; and
- a storage means for storing an output signal of the tracking AD converting means and outputting the stored signal as a temperature value,
- wherein the semiconductor memory device enters a power save mode for a predetermined time starting from an activation of the internal control signal and wherein during the power save mode, the semiconductor memory device has reduced power consumption.

21. The semiconductor memory device of claim 20, wherein the power save mode is an idle state or a power down mode.

22. The semiconductor memory device of claim 20, wherein the power save mode is a non-access mode in which a memory core is not accessed.

23. The semiconductor memory device of claim 20, wherein the control signal controls an impedance matching of ODT (On Die Termination) or OCD (Off Chip Driver) for a predetermined time.

24. The semiconductor memory device of claim 20, further comprising a mode register to set the predetermined time the control signal is inputted.

25. The semiconductor memory device of claim 24, wherein the driving control means includes:
- a noise-free-section alarm means for outputting a noise-free-section signal which is activated for a predetermined time; and
- a driving signal generating means for activating the driving signal after a predetermined time starting from the activation of the internal control signal and for inactivating the driving signal in response to the noise-free-section signal.

26. The semiconductor memory device of claim 25, wherein the counting means includes:
- a MRS decoding means for decoding a value which is set in the mode register and outputting a plurality of set-up signals;
- a counter to count the number of times the control signal is inputted and then outputting a plurality of counting signals;
- a comparison means for activating an output signal when the set-up signal and the counting signal have the same value; and
- an internal control signal generating means for producing the internal control signal using an output signal of the comparison means in response to the control signal.

27. The semiconductor memory device of claim 26, wherein the noise-free-section alarm means includes a counter or a ring oscillator.

28. The semiconductor memory device of claim 27, wherein the comparison means includes:
- a plurality of exclusive-NOR logic gates, each of which receives one of the plurality of set-up signals and one of the plurality of counting signals;
- a first NAND gate for performing a NAND operation to output signals of the plurality of exclusive-NOR logic gates; and
- a first inverter to invert an output signal of the first NAND gate.

29. The semiconductor memory device of claim 28, wherein the internal control signal generating means includes:
- a flip-flop for receiving the output signal of the comparison means in response to the control signal; and
- a signal generating means for outputting the internal control signal by sensing an activation of the output signal of the comparison means or the flip-flop.

30. The semiconductor memory device of claim 29, wherein the signal generating means includes:
- a first edge detecting means for detecting the activation of the output signal of the comparison means;
- a second edge detecting means for the activation of the output signal the flip-flop; and
- an output means for outputting the internal control signal when output signals of the first and second first edge detecting means are activated.

31. The semiconductor memory device of claim 30, wherein the first and second edge detecting means respectively includes:
- an inverter chain for delaying and inverting an input signal; and
- a second NAND gate for performing a NAND operation to an output signal of the inverter chain and the input signal.

32. The semiconductor memory device of claim 31, wherein the output means includes a NAND gate which receives output signals of the first and second edge detecting means and then outputs the internal control signal.

33. The semiconductor memory device of claim 32, further comprising a decoding means for decoding a plurality of external command signals and outputting the control signal.

34. A semiconductor memory device comprising:
- a counting means for counting inputs of control signals and for outputting an internal control signal when the number of times the control signals are inputted;
- a driving control means for activating a driving signal in response to a control signal and maintaining the activation of the driving signal until a subsequent control signal is inputted;
- a temperature sensor to sense a current temperature in response to the driving signal;

a tracking AD (Analog to Digital) converting means for converting an analog signal from the temperature sensor into a digital signal in response to the driving signal and a sample clock signal;

a tracking control means for proving the sample clock signal in response to a level signal from the tracking AD converting means; and a storage means for storing an output signal of the tracking AD converting means and outputting the stored signal as a temperature value, wherein the semiconductor memory device enters a power save mode for a predetermined time starting from an activation of the internal control signal and wherein during the power save mode, the semiconductor memory device has reduced power consumption.

35. The semiconductor memory device of claim 34, wherein the power save mode is an idle state or a power down mode.

36. The semiconductor memory device of claim 34, wherein the power save mode is a non-access mode in which a memory core is not accessed.

37. The semiconductor memory device of claim 34, wherein the control signal controls an impedance matching of ODT (On Die Termination) or OCD (Off Chip Driver) for a predetermined time.

38. The semiconductor memory device of claim 34, further comprising a mode register to set the predetermined time the control signal is inputted.

39. The semiconductor memory device of claim 38, wherein the driving control means includes:
a noise-free-section alarm means for outputting a noise-free-section signal which is activated for a predetermined time; and
a driving signal generating means for activating the driving signal after a predetermined time starting from the activation of the internal control signal and for inactivating the driving signal in response to the noise-free-section signal.

40. The semiconductor memory device of claim 39, wherein the tracking control means includes:
a level change detecting means for receiving the level signal and detecting a level change; and
a clock providing means for providing the clock signal as the sample clock signal in response to an output signal of the level change detecting means or an activation of the noise-free-section signal.

41. The semiconductor memory device of claim 40, wherein the clock providing means includes:
a dividing control means for outputting a divider driving signal in response to the output signal of the level change detecting means or the activation of the noise-free-section signal; and
a dividing means for dividing the clock signal and outputting the sample clock signal when the divider signal is activated.

42. The semiconductor memory device of claim 41, wherein the level change detecting means includes:
a first flip-flop to which the level signal is applied in synchronization with a delayed sample clock signal;
an XOR logic gate for performing a XOR operation to an output signal of the first flip-flop and the level signal; and
a second flip-flop, to which an output signal of the XOR logic gate is applied in response to the delayed sample clock signal, for outputting a level change signal indicative of the level change.

43. The semiconductor memory device of claim 42, wherein the dividing control means includes:

a NOR logic gate to which the level change signal and the noise-free-section signal are applied; and
an inverter for outputting the divider driving signal by inverting an output signal of the XOR logic gate.

44. The semiconductor memory device of claim 43, wherein the counting means includes:
a MRS decoding means for decoding a value which is set in the mode register and outputting a plurality of set-up signals;
a counter to count the number of times the control signal is inputted and then outputting a plurality of counting signals;
a comparison means for activating an output signal when the set-up signal and the counting signal have the same value; and
an internal control signal generating means for producing the internal control signal using an output signal of the comparison means in response to the control signal.

45. The semiconductor memory device of claim 44, wherein the comparison means includes:
a plurality of exclusive-NOR logic gates, each of which receives one of the plurality of set-up signals and one of the plurality of counting signals;
a first NAND gate for performing a NAND operation to output signals of the plurality of exclusive-NOR logic gates; and
a first inverter to invert an output signal of the first NAND gate.

46. The semiconductor memory device of claim 45, wherein the internal control signal generating means includes:
a flip-flop for receiving the output signal of the comparison means in response to the control signal; and
a signal generating means for outputting the internal control signal by sensing an activation of the output signal of the comparison means or the flip-flop.

47. The semiconductor memory device of claim 46, wherein the signal generating means includes:
a first edge detecting means for detecting the activation of the output signal of the comparison means;
a second edge detecting means for the activation of the output signal the flip-flop; and
an output means for outputting the internal control signal when output signals of the first and second first edge detecting means are activated.

48. The semiconductor memory device of claim 47, wherein the first and second edge detecting means respectively includes:
an inverter chain for delaying and inverting an input signal; and
a second NAND gate for performing a NAND operation to an output signal of the inverter chain and the input signal.

49. The semiconductor memory device of claim 48, wherein the output means includes a NAND gate which receives output signals of the first and second edge detecting means and then outputs the internal control signal.

50. The semiconductor memory device of claim 49, further comprising a delayer to output the delayed sample clock signal by delaying the sample clock signal by an amount of delay which the tracking AD converting means has.

51. The semiconductor memory device of claim 50, wherein the driving signal generating means includes a timer.

52. The semiconductor memory device of claim 51, wherein the noise-free-section alarm means includes a counter.

53. The semiconductor memory device of claim 52, further comprising a decoding means for decoding a plurality of external command signals and outputting the control signal.

54. A method for driving a semiconductor memory device comprising:
counting the number of times control signals are inputted;
sensing a current temperature when the number of times the control signals are inputted; and
entering a power save mode for a predetermined time within the sensing the current temperature, wherein during the power save mode, the semiconductor memory device has reduced power consumption.

55. The method of claim 54, wherein the power save mode is an idle state or a power down mode.

56. The method of claim 54, wherein the power save mode is a non-access mode in which a memory core is not accessed.

57. The method of claim 54, wherein the control signal controls an impedance matching of ODT (On Die Termination) or OCD (Off Chip Driver) for a predetermined time.

58. The method of claim 54, wherein the sensing a current temperature includes:
sensing an analog level signal corresponding to the current temperature; and
outputting a digital signal corresponding to the analogue level signal.

59. The method of claim 58, wherein the outputting a digital signal includes:
detecting a difference between the sensed analog level signal and the digital signal; and
tracking the sensed analogue level signal when the difference occurs or during a non-active mode of the semiconductor memory device.

60. A semiconductor memory device comprising:
a temperature sensing means for sensing a current temperature in response to a control signal; and
a refresh means for refreshing the semiconductor memory device based on a time period which is determined on an output signal of the temperature sensing means,
wherein the semiconductor memory device enters a power save mode for a predetermined time starting from an activation of the control signal and wherein during the power save mode, the semiconductor memory device has reduced power consumption.

61. A semiconductor memory device comprising:
a counting means for counting inputs of a control signal and for outputting an internal control signal based on the number of predetermined times the control signal is inputted;
a temperature sensing means for sensing a current temperature in response to the internal control signal; and
a refresh means for refreshing the semiconductor memory device based on a time period which is determined on an output signal of the temperature sensing means,
wherein the semiconductor memory device enters a power save mode for a predetermined time starting from an activation of the control signal and wherein during the power save mode the semiconductor memory device has reduced power consumption.

62. The semiconductor memory device of claim 61, further comprising a mode register to set the predetermined time the control signal is inputted.

63. The semiconductor memory device of claim 61, wherein the power save mode is an idle state or a power down mode.

64. The semiconductor memory device of claim 61, wherein the power save mode is a non-access mode in which a memory core is not accessed.

65. The semiconductor memory device of claim 61, wherein the control signal controls an impedance matching of ODT (On Die Termination) or OCD (Off Chip Driver) for a predetermined time.

* * * * *